(12) United States Patent
Kinsho et al.

(10) Patent No.: US 6,741,133 B2
(45) Date of Patent: May 25, 2004

(54) HIGH OUTPUT AMPLIFIER FOR STABLE OPERATION

(75) Inventors: Kenji Kinsho, Tokyo (JP); Hideo Akama, Tokyo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/175,369

(22) Filed: Jun. 19, 2002

(65) Prior Publication Data

US 2003/0025560 A1 Feb. 6, 2003

(30) Foreign Application Priority Data

Jul. 31, 2001 (JP) ......................................... 2001-232736

(51) Int. Cl.[7] ................................................ H03F 3/26
(52) U.S. Cl. ....................................... 330/263; 330/265
(58) Field of Search ................................ 330/263, 264, 330/265, 267, 281

(56) References Cited

U.S. PATENT DOCUMENTS 5,410,274 A  *  4/1995  Birdsall et al. ............. 330/265
5,418,495 A  *  5/1995  Harvey ....................... 330/265

FOREIGN PATENT DOCUMENTS

JP             08032367        2/1996

OTHER PUBLICATIONS

German Search Report Application No. 102 32 633.9.
Tietze and Schenk, C.: Halbleiter–Schaltungstechnik, vol. 11, Springer–Verlag, Berlin, u.a., 1999, pp. 822–949, ISBN 3–540–64192–0.

* cited by examiner

*Primary Examiner*—Steven J. Mottola

(57) ABSTRACT

A high output amplifier includes a comparison amplifier having a first input, a second input, and an output, wherein a set voltage is applied to the first input, a voltage of the output is coupled to the second input, and the output is generated in response to a difference between the voltage applied to the first input and the voltage coupled to the second input. The high output amplifier also includes a low-pass filtering device that receives and performs low-pass filtering on the output of the comparison amplifier, a conversion device that converts the output of the low-pass filtering device to complementary signals, and a push-pull output device, driven by the complementary signals, that supplies electrical current to a load, wherein an increase in the electrical current supplied by the push-pull output device is decreased by changes in the load due to the low-pass filtering device.

5 Claims, 4 Drawing Sheets

20

30

HIGH OUTPUT AMPLIFIER FOR STABLE OPERATION

BACKGROUND OF THE INVENTION

1. Field of the Invention

This invention relates to an amplifier for driving a load, and, in particular, it relates to an amplifier that is high-speed, of high output power and stable in varying load.

2. Background Arts

There are cases in which the necessity arises for high-speed and high-electric-power driving of circuit elements that serve as loads in various types of electrical and electronic devices such as circuit element testers. In such cases, push-pull amplifiers, complementary amplifiers or combinations thereof are frequently used as the high output amplifiers which are the final stages in which such driving is performed.

A push-pull amplifier that is constructed using bipolar transistors is described in Japanese Laid-open Publication JP1996-32367A. This push-pull amplifier could show a lower crossover distortion without increasing an idling current (through current) in the output stage and high efficiency. Because any part of the circuit is not cut off there is not accumulation of minority carriers, which may be a problem with bipolar transistors, then, higher speed and broader bands can be achieved.

FIG. 1 shows high output amplifier 10 based on a conventional technology similar to that of the aforementioned push-pull amplifier. The high output amplifier 10 is constructed of circuit elements arranged between supply voltages VD and VS. Load voltage V2, which is essentially equal to control voltage V1 that has been input into terminal 1, is output to terminal 2. Transistors Q1 and Q2 are biased by a series of bias circuits comprised of resistances R1 and R2 and diodes D1 and D2. Terminal 1 is connected to a common connecting point of diodes D1 and D2 so that control voltage Vc is input into the control terminals (bases) of transistors Q1 and Q2 respectively. Transistors Q1 and Q2 are, respectively, NPN and PNP transistors and their emitters are connected to terminal 2 through resistance R4 or resistance R5. Transistors Q1 and Q2 act as a complementary buffer. The respective collectors of transistors Q1 and Q2 are connected to supply voltages VD and VS through resistances R3 and R6 respectively and are also connected to the non-inverting input terminals of amplifiers A1 and A2. Outputs of amplifiers A1 and A2 are connected to the gates of respective transistors Q3 and Q4 and the inverting input terminals of amplifiers A1 and A2 are connected to the sources of the respective transistors Q3 and Q4. Further, the sources of transistors Q3 and Q4, which are field effect transistors (FET), are connected to the respective supply voltages VD and VS through resistances R7 and R8. The drains of transistors Q3 and Q4 are both connected to terminal 2. Load LD is connected to terminal 2. Load LD may generally be passive or active.

First, we shall consider this amplifier 10 by ignoring transistors Q3 and Q4. Transistors Q1 and Q2 act in response to control voltage Vc so as to output voltage V2, which is close to control voltage Vc, to load LD. However, when load LD is heavy (when load current I2 is high such as in the case of low load impedance), load voltage V2 does not follow control voltage Vc. At a setting at which load current I2 flows out to load LD, transistor Q1 approaches saturation due to an increase of load current I2 and transistor Q2 is cut off. However, load current I2 also flows to resistance R3 and voltage is generated across resistance R3. Amplifier A1 controls the gate voltage of transistor Q3 so that the voltage applied across resistance R3 and the voltage applied across resistance R7 become equal to each other. Current of a value obtained by dividing the value of voltage across the resistance R3 by the value of resistance R7 is supplied from the drain of transistor Q3 to the terminal 2. When this occurs, the current flowing through transistor Q1 is decreased and the voltage across resistance R3 is also decreased. By means of this negative feedback, high output amplifier 10 is stabilized when the voltage applied across resistance R3 reaches a certain level. Similar stabilization also occurs at a setting at which load current I2 flows in from load LD. Similar actions are also effected on the sides of transistors Q2 and Q4. Consequently, there are two feedback loops of electrical signals. In one loop the signal is fed back from terminal 2 to terminal 2 via the transistor Q1, amplifier A1 and transistor Q3 and in another loop the signal is fed back from terminal 2 to terminal 2 via the transistor Q2, amplifier A2 and transistor Q4. So that any electrical signal on terminal 2, input to or generated at terminal 2, which may be a change in voltage or current through originated from a change in voltage, current or circuit parameter, is fed back negatively.

In the amplifier 10 of FIG. 1, as indicated above, we have described transistors Q3 and Q4 as field effect transistors for high power use. However, they may also be bipolar transistors for high power use and switching-mode power sources. Further, field effect transistors or amplifiers may be used in place of transistors Q1 and Q2. However, transistors Q1 and Q2 are generally of comparatively high speed and low power and transistors Q3 and Q4 are of comparatively low speed and high power.

When transistors Q3 and Q4 are field effect transistors or bipolar transistors as described above, and, in particular, the circuit parameters are set so that the output currents of the transistors do not become completely zero even if the load current is zero. This is performed for the purpose of fast response when the load has suddenly changed. Accordingly, when the load current is zero in this way, the through current that flows through the two transistors is called the design through current.

Where load LD may have various type of impedance (passive or active) the aforementioned negative feedback loop may possibly be changed to a positive feedback loop to cause oscillation. Therefore, capacitors C1 and C2 are connected in parallel to resistances R3 and R4 and roll-off of the negative feedback loop is effected. When transistors Q3 and Q4 are power field effect transistors, the frequency characteristics of these power field effect transistors do not extend over a wide range. Then without capacitors C1 and C2, the actual power field effect transistors can simulate equivalents of wide-band field effect transistors with capacitors C1 and C2.

SUMMARY OF THE INVENTION

Although a structure like that of high output amplifier 10 described above is stable when the load current changes slowly, there is the possibility that a large through current that exceeds the expected design through current will be generated in transistors Q3 and Q4 when the load current changes suddenly (quickly). For example, there are cases in which a suitable load resistance is connected and in which the input voltage changes rapidly, i.e., more rapidly than the response speed of the aforementioned negative feedback loop. Further, when high output amplifier 10 is used in the device power source of an integrated circuit (IC) tester, there are cases in which the operating state of an IC that is connected as the load will change due to signals from the outside. For example, when there has been a change from the usual operating state to a standby state, the load current changes more rapidly than the response speed of the aforementioned negative feedback loop of high output amplifier 10.

In order to clearly understand problems this invention intends to solve, we should consider the case in which load current I2 flowing into the current source load LD changes alternately and rapidly between 0 and IL. When load current I2 is IL, said load current I2 flows out from terminal 2 to the load (current source load).

(a) A steady state in which the load current I2 is 0: The voltages of terminal 1 and terminal 2, although this is not essential, are supposed to be both zero(0) for the sake of convenience. The gate voltages of transistors Q3 and Q4 are close to the respective threshold voltages and the respective drain currents are at low levels to give a design through current. The voltages applied on resistances R7 and R8 are controlled according to the non-inverting input terminal voltages of amplifiers A1 and A2 that are set depending on resistances R4 and R5 which have low resistance levels, and resistances R3 and R6 which are the collector resistances to the transistors Q1 and Q2.

(b) A state in which load current I2 changes rapidly from 0 to IL: At first, transistors Q3 and Q4 are not essentially operated, the emitter voltage of transistor Q1 is decreased and load current I2 is supplied from transistor Q1. The voltage across resistance R3 begins to rise accompanying the charging of capacitor C1 by the collector current of transistor Q1. The emitter voltage of transistor Q2 falls and transistor is essentially cut off, the voltage across resistance R6 begins to decrease at a time constant of R6*C2 then transistor Q4 goes off.

(c-1) A case in which load current I2 abruptly changes instantaneously from 0 to IL, after that the constant value IL of I2 is maintained: The current from transistor Q3 to terminal 2 is increased as the voltage across resistance R3 rises. Consequently, the current that is supplied from transistor Q1 to the load LD decreases and the rise of the voltage across resistance R3 is slowed down. The voltage of terminal 2 gradually rises, then the sum of the emitter current of transistor Q1 and the drain current of transistor Q3 becomes equal to load current I2(IL) to be stabilized When the level IL of load current I2 is high, it is designed so that the drain current of transistor Q3 accounts for most of load current I2.

(c-2) A case in which load current I2 changes instantaneously from 0 to IL, maintains a constant value of IL for a short time then returns to 0: This case differs from the case (c-1) and a through current flows through transistors Q3 and Q4 as below described.

The current from transistor Q3 to terminal 2 is increased as the voltage across resistance R3 rises. Consequently, the current from transistor Q1 to load LD decreases and the rise in the voltage across resistance R3 is slowed down. The voltage of the terminal 2 gradually rises and the sum of the emitter current of transistor Q1 and the drain current of transistor Q3, as load transistor Q2 remains off, becomes equal to load current I2 and stabilized. When the IL level of load current I2 is high, it is designed so that the drain current of transistor Q3 accounts for most of load current I2.

Then, when load current I2 returns to 0, the current flowing out from transistor Q3 causes the voltage of the terminal 2 to rise, transistor Q1 is cut off, transistor Q2 is turned on, current flows into the transistor Q2 and the voltage of the non-inverting input terminal of amplifier A2 is raised. As the voltage of said non-inverting input terminal rises, transistor Q4 is turned on and current is drawn from the terminal 2. Consequently, a through current that passes through transistor Q3 and transistor Q4 is generated. Because discharge of capacitor C1 does not occur rapidly, the through current persists for some time.

(d) From the state (c-2) described above up to the state in which load current I2 again assumes the level IL after a short time and then returns to 0: The voltages across capacitors C1 and C2 are greater than those in the case (a), a larger through current flows into transistors Q3 and Q4. Consequently, when the load current again assumes the level IL, the current from transistor Q3 becomes approximately the sum of the through current and load current I2. There is very slight discharge of capacitor C2 during the period that load current I2 assumes the value IL. Thus, when load current I2 goes to 0, increase of the voltage across capacitor C2 causes a further increase in the through current.

As should be clear from the foregoing description, when process (d) described above is repeated, the through current gradually increases. This through current is not extracted to the outside as load current I2, causing an increase in the internally power consumption of transistors Q3 and Q4. When the internally consumed power is low, no particular problems occur. However, in high power devices, it reaches several tens of W to several hundred of W. In extreme cases, transistors Q3 and Q4 themselves may be destroyed. Even when this does not happen, operation of transistors Q3 and Q4 becomes unstable since the operation is not performed at the operating point initially designed.

Consequently, the object of this invention is to provide a stable high output amplifier with which increases exceeding the design through current of the through current are controlled and which results in low internally power consumption.

The high output amplifier of this invention for the purpose of solving the aforementioned problems is equipped with a comparison amplifier in which the set voltage is received in the input of one side, a voltage of the output side is returned to the input of the other side and that generates output in response to the difference between the voltage of the aforementioned voltage of one side and the voltage of the aforementioned voltage of the other side, a low-pass filtering device that receives the output of the comparison amplifier, and that performs low-pass filtering of the output of the aforementioned comparison amplifier and outputs it, conversion devices that convert the output of said low-pass filtering device to complementary signals and push-pull output devices that supply electrical current for loading and that are driven by said complementary signals for outputting the voltage of the aforementioned output side, an increase in the through current of the aforementioned push-pull output device being decreased by changes in the aforementioned load due to the aforementioned low-pass filtering device. Consequently, a high output amplifier that is stable and consumes low power internally.

In the high output amplifier of this invention, the aforementioned comparison amplifier may be a complementary amplifier that generates complementary output and in that the aforementioned low-pass filtering device connects the complementary output of the aforementioned comparison amplifier and subjects it to low-pass filtering. When this is done, both of the complementary outputs of the complementary amplifier are used. Therefore, the response of the push-pull output stage is further accelerated when there is an abrupt change in load current.

The high output amplifier of this invention may be equipped with a buffer that receives the voltage set by the aforementioned comparison amplifier in the input of one side and with a resistance element that connects the output of said buffer with the input of the aforementioned other side so that the aforementioned voltage output can be obtained from the aforementioned resistance element. When this is done, a simple structure can be achieved whereby changes in the load current are detected directly and high-speed response can be effected.

In the high output amplifier of this invention, an integrating-type adder amplifier may be used as the low-pass filtering device. When it is constructed in this way, the frequency characteristics of the feedback circuit can be determined solely by adjustment of the integrating adder-type amplifier. Consequently, the driving of the push-pull output stage can be set so that the through current is increased.

Further, the aforementioned conversion device can be constructed so that it performs a low-pass filtering action for differing complementary signals that are output. By this means, variations in the response characteristics of the elements of the push-pull output stage can be regulated. Consequently, a high output amplifier with which there is little increase in through current at higher speeds can be obtained.

As described above, because the high output amplifier of this invention is stable in the presence of variations of load current, it is particularly suited for use with an IC tester so that the aforementioned push-pull output stage supplies current to the device to be tested by the IC tester.

DETAILED DESCRIPTION OF THE INVENTION

Figure 1:
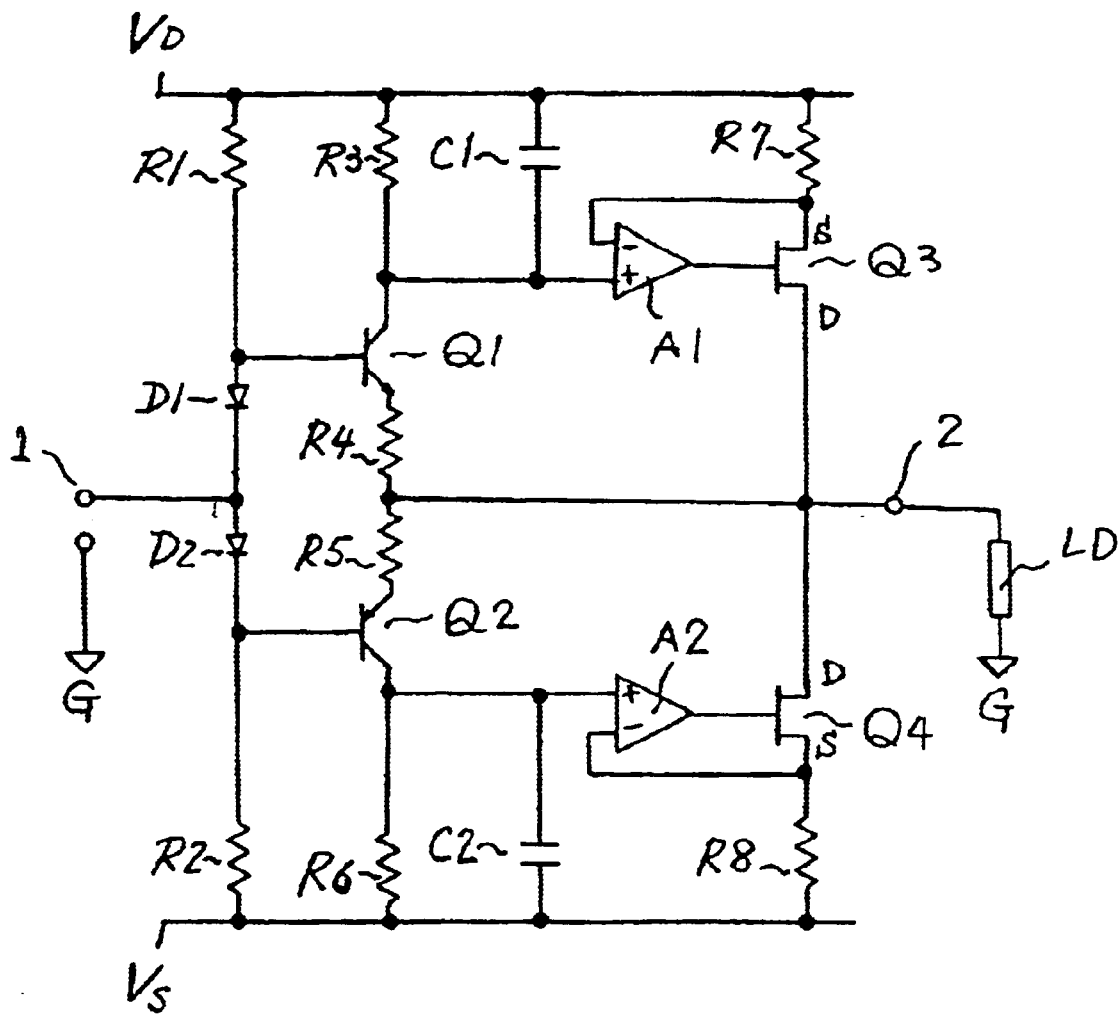
FIG. 1 is a schematic circuit diagram of a high output circuit based on the prior art.
Figure 2:
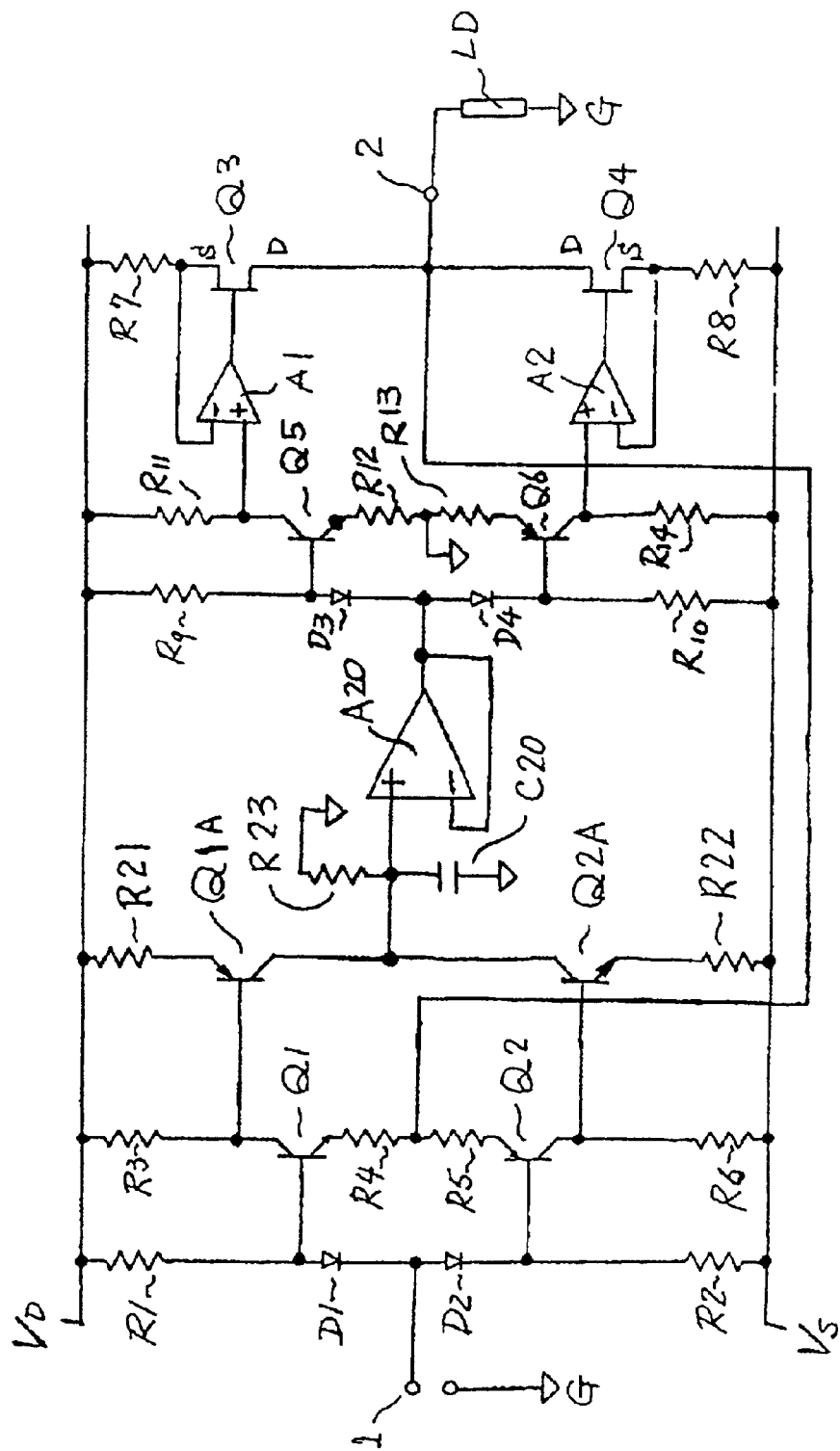
FIG. 2 is a schematic diagram of the high output amplifier according to the first embodiment of this invention.
Figure 3:
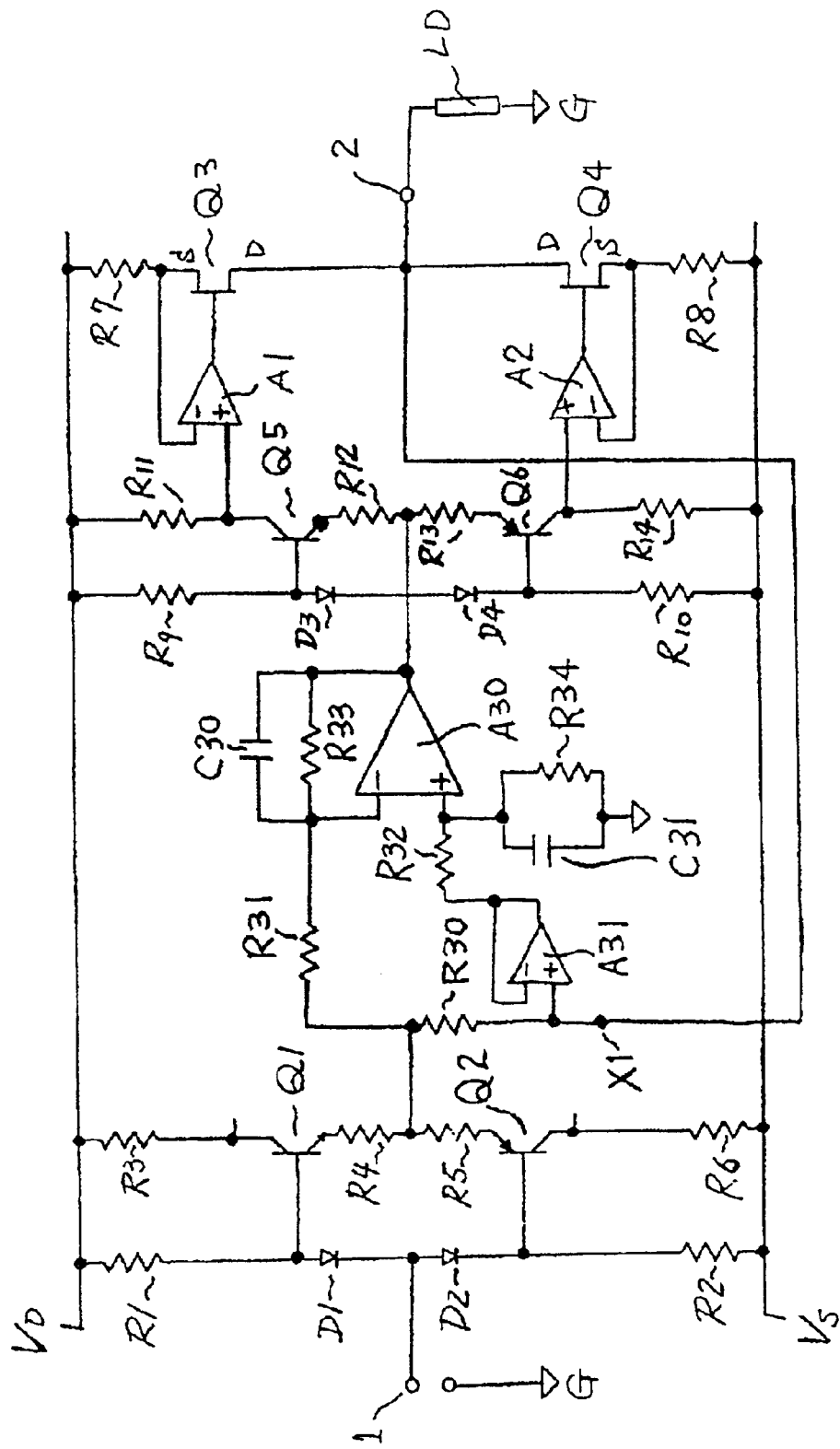
FIG. 3 is a schematic diagram of the high output amplifier according to the second embodiment of this invention.

High output amplifiers 20 and 30 as shown in FIG. 2 and FIG. 3 are presented for the purpose of explanation of this invention. In FIG. 2 and FIG. 3, the same reference numbers as in FIG. 1 are used for equivalent circuit elements in explaining the circuit elements and this invention. Further, explanations of bipolar transistors, which are used instead of field effect transistors (FET) and amplifiers (OPAMP), are omitted as they are well-known to persons of average skill in the art. Nevertheless, they are not excluded from the scope of this invention.

This invention is based on a structure whereby the structure that surpresses the increase of the through current of the push-pull output stage and the structure which increases the stability of the high output circuit do not readily interfere with each other.

FIG. 2 shows an example of a schematic circuit diagram of high output amplifier 20, which is the first embodiment of this invention. Supply voltages VD and VS are explained as being of equal magnitude and of opposite polarity. However, as those persons skilled in the art should easily understand, other supply voltages can be selected. For example, the VS can be 0V (ground) and the ground in FIG. 2 can be a voltage of one-half the VD or it can be a voltage that is higher or lower than one-half of it. Terminal 1, resistances R1 to R6, diodes D1 and D2 and transistors Q1 and Q2 are connected as described in FIG. 1 and form a comparison amplifier constructed as a complementary amplifier. A set voltage is input into terminal 1, which is the input on one side, the voltage of terminal 2 on the output side is fed back to the junction of resistances R4 and R5, which is the input on the other side, and the voltage outputs, which corresponds to the difference between the aforementioned voltage of the input on one side and the aforementioned voltage of the input on the other side, are generated in the collectors of NPN transistor Q1 and PNP transistor Q2. These voltage outputs are subjected to voltage current conversion by resistance R21 and PNP transistor Q1A, or, by resistance R22 and NPN transistor Q2A, then are added and combined to become input into the non-inverting input terminal of amplifier A20. Capacitor C20 and resistance R23 are also connected to the non-inverting input terminal of amplifier A20, and the current signals, which have been added and combined, are converted to voltage signals and subjected to low-pass filtering, and are then input into the non-inverting input terminal of amplifier A20. The inverting input terminal and the output terminal of amplifier A20 are directly connected or are connected by resistances and amplifier A20 functions as a buffer of amplification factor 1.

The output of amplifier A20 is input into the succeeding conversion device. The conversion device has a comparable structure to that of the comparison amplifier. The junctions of diodes D3 and D4, resistances R9 to R14, diodes D3 and D4 and transistors Q5 and Q6 correspond respectively to terminal 1, resistances R1 to R6, diodes D1 and D2 and transistors Q1 and Q2 of the comparison amplifier. The junctions of resistances R12 and R13, which correspond to resistances R4 and R5, are grounded. The output of amplifier A20 is input into the junction of diodes D3 and D4 and provides complementary output to the collectors of NPN transistor Q5 and PNP transistor Q6. Each of said complementary outputs is input into the non-inverting input terminals of amplifiers A1 and A2 and the respective drain currents of P channel transistor Q3 and N channel transistor Q4 that are supplied to terminal 2 are controlled. Resistances R7 and R8 are, while depending on the design of the drain currents, often of values of 1 ohm or less.

Load current I2 that flows into load LD is increased, the emitter current of transistor Q1 is increased and the emitter current of transistor Q2 is decreased. Consequently, the collector voltages of both transistors fall. The emitter voltage of transistors Q1A and Q2A also falls accompanying the fall in the collector voltages of two transistors Q1 and Q2. The collector current of transistor Q1A increases, the collector current of transistor Q2A decreases, the added collector currents of the two transistors are converted to voltages that are raised by parallel connection of resistance R23 and capacitor C20 and become the input voltage of amplifier A20 to the non-inverting input terminal. Consequently, the output of amplifier A20 is input into the junction of diodes D3 and D4 which connects the bases of NPN transistor Q5 and PNP transistor Q6. When this is done, the drain current of transistor Q3 is increased and the drain current of transistor Q4 is decreased. The current through transistor Q4 is a through current, and, in the operation described above, undergoes essentially no increase from the design through current. Even if the load current undergoes further fluctuation, the through current undergoes essentially no increase from the initial value at the load current 0 due to the presence of the load current.

For the foregoing operation, capacitor C20 is selected appropriately and the stability of the feedback operation is assured so that the intrinsic time constants (which are transmission properties from gate to drain) of transistors Q3 and Q4 do not affect the stability of the feedback loop. Specifically, R23×C20 should be selected as a value greater than several times the intrinsic time constants of Q3 and Q4. Further, when there is a considerable difference between the properties of transistors Q3 and Q4, values of resistances R11 to R14 are adjusted, or a capacitor and/or a low-pass filtering element are connected in parallel to either the resistance R11 or R14, so that a difference in drain currents are controlled, an increase in through current is inhibited. As a result the stability and response to load current fluctuations may be improved in high output amplifier 20.

The comparison amplifier of high output amplifier 20 shown in FIG. 2 can also be replaced functionally by an operational amplifier if control capacity of the load currents due to transistors Q1 and Q2 is not desired. It is also possible to use field effect transistors as transistors Q1 and Q2 to harmonize their manufacturing process with the processes for other elements.

In addition, transistors Q3 and Q4 can be bipolar transistors depending on the operating speed and the output power and can also be switching-type voltage to current converters.

It is also possible to by-pass amplifier A20 and the structure of high output amplifier 20 is simplified. The gates of transistors Q3 and Q4 can be controlled so that the voltages across resistances R11 and R12 of amplifiers A1 and A2 become precisely the voltages across resistances R7 and R8. However, simple buffers and/or direct connections are also possible as is described below further.

FIG. 3 shows an example of a schematic circuit diagram of high output amplifier 30 which is the second embodiment of this invention. Terminal 1, resistances R1 to R6, diodes D1 and D2 and transistors Q1 and Q2 are connected to form a complementary amplifier (buffer) as is shown in FIG. 1. The complementary amplifier with resistance R30 connected to its output forms a comparison amplifier. The input of one side of the comparison amplifier is terminal 1 and the input of the other side is considered to be a point X1 which is the point at which the resistance R30 is connected to terminal 2. Amplifier A30 amplifies differentially the voltages on the respective terminals of resistance 30. The circuit components subsequent to the output terminal of amplifier A30 are connected to form the same structure and to perform the same function as in the first embodiment of this invention to which FIG. 2 pertains. However, the output of amplifier A30 is fed to the junction of resistances R12 and R13, which differs from high output amplifier 20 where the output of amplifier A20 is fed to the junction of diodes D3 and D4.

The output of the complementary amplifier (buffer) is produced at the junction of resistances R4 and R5 and is input into the inverting input terminal of amplifier A30 via resistance R31 and the load voltage that is produced on terminal 2 is input from point X1 into the non-inverting input terminal of amplifier A30 via buffer A31 and resistance R32. In addition, the non-inverting input terminal of amplifier A30 is grounded via parallel combination of resistance R34 and capacitor C31. Further, resistance R33 and capacitor C30 are connected in parallel between the inverting input terminal and the output terminal of amplifier A30. Because it is constructed in this way, the voltage produced across resistance R30 is differentially amplified and is subjected to low-pass filtering, and is then transmitted from the output terminal of amplifier A30 to the junction of resistances R12 and R13. Resistances R31 and R32 may be selected so that they are equal in value, resistance R33 and resistance R34 may be selected so that they are equal in value and capacitor C30 and capacitor C32 may be selected so that they are equal in value. A value of R33×C30 should be selected at a level several times the inherent time constants of Q3 and Q4 so that the inherent time constants of Q3 and Q4 have essentially no effect on the stability of the (negative) feedback operation.

When resistance R30 is several ohms and resistances R31 and R32 are several kilo-ohms, there may be essentially no deterioration of performance even when buffer A31 is shorted out, the circuit is simplified and resistance R32 is directly connected to resistance R30 and terminal 2. This is because buffer A31 is connected to the terminal 2 only to prevent loading of resistance R32 and etc for improving precision in detecting an increase of the load current.

As is described in the first embodiment of this invention shown in FIG. 2, when the load current changes, the voltage on terminal 2 changes along with it and this is detected directly by resistance R30. The fluctuating voltage that has been detected is subjected to low-pass filtering and is supplied to the conversion device from the junction of resistances R12 and R13. As a result, the drain currents of transistors Q3 and Q4 are controlled. Resistances R3 to R6 can be omitted to enhance the buffering capacity of the complementary amplifier (buffer). In the second embodiment as well, the stability of the circuits of high output amplifier 30 is substantially controlled by the effect of the low-pass filtering when the voltage signals pass through amplifier A30 and the through current is controlled by the succeeding conversion device as is controlled in the first embodiment.

Figure 4:
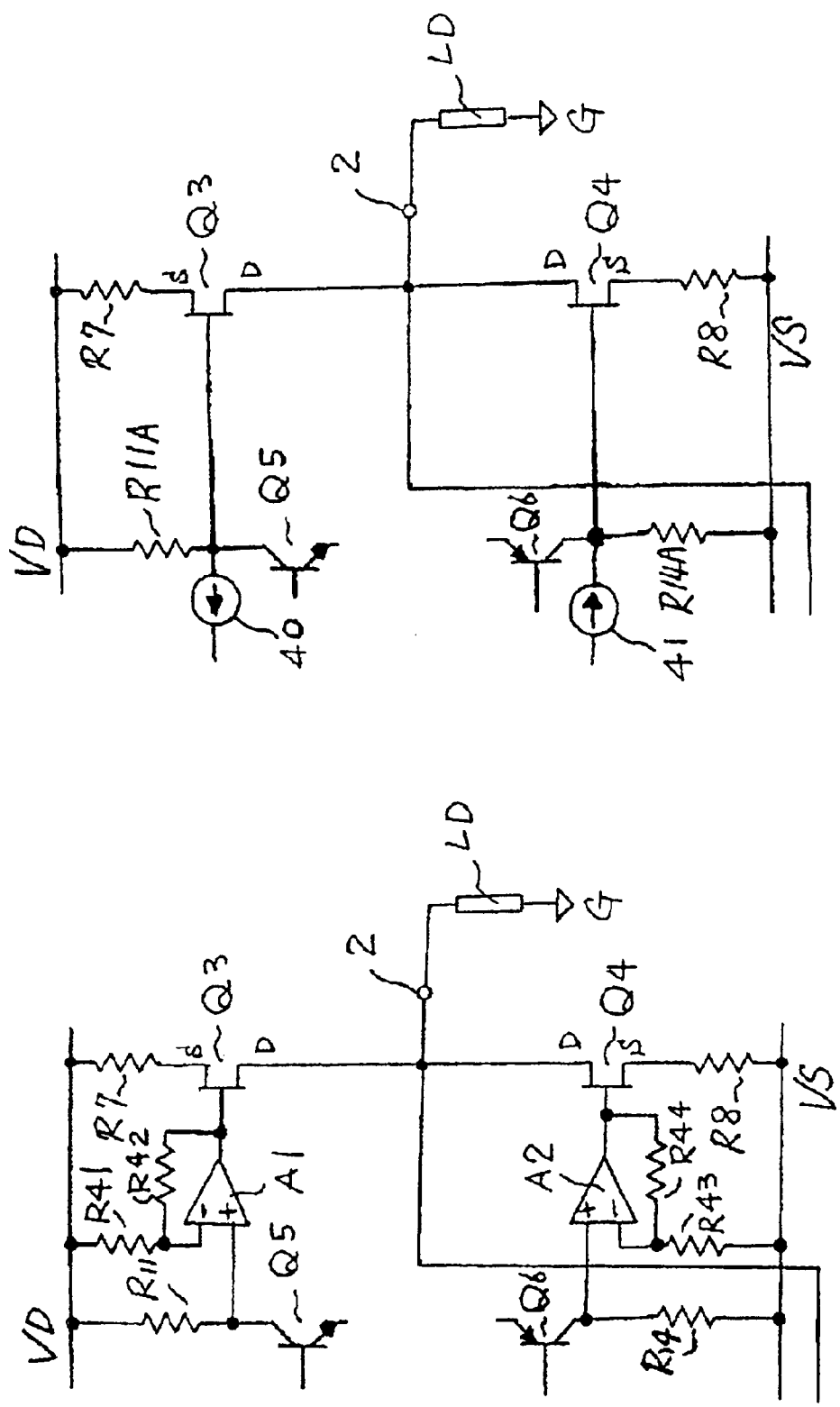
FIG. 4 is a schematic circuit diagram of modified embodiments of the output stage of the high output amplifiers according to this invention.

Next, referring to FIG. 4, we shall describe the structure of a modified embodiment of the output parts of high-output amplifiers of this invention which are connected to the output of transistors Q5 and Q6. The structures described below may be conveniently used in both of high output amplifiers 20 and 30.

As shown in FIG. 4(A), the inverting input terminal of amplifier A1 is connected to supply voltage VD via resistance R41 and the output terminal of amplifier A1 via resistance R42, then connecting to the gate of transistor Q3. In addition, the inverting input terminal of amplifier A2 is connected to supply voltage VS via resistance R43 and to the output terminal of the amplifier A2 via resistance R44, then connecting to the gate of transistor Q4. A difference in conductance between transistors Q3 and Q4 can be cancelled by adjusting resistances R41–R44 to changing the gains of amplifiers A1 and A2. Resistances R41 and R43 may be omitted and amplifiers A1 and A2 act as buffers which have good driving capability with unity gain.

As shown in FIG. 4(B), in further modified embodiment of the invention, resistances R11 and R12 can be replaced by resistances R11A and R12A, respectively. Next, amplifiers A1 and A2 are shorted out and the collectors of transistors Q5 and Q6 are directly connected to the gates of transistors Q3 and Q4. Direct-current sources 40 and 41 are also connected to the collectors of transistors Q5 and Q6.

In the structure as described, a mismatching in conductance between transistors Q3 and Q4 can be cancelled by adjusting resistances R11A and R12A and a mismatching in the gate threshold voltage between transistors Q3 and Q4 can be cancelled by adjusting direct-current sources 40 and 41. The design through current can also be adjusted by resistances R11A and R12A and direct-current sources 40 and 41.

Further, in the circuit shown in FIG. 4(A), direct-current sources 40 and 41 can be respectively connected to the respective collectors of transistors Q5 and Q6 or to the respective inverting input terminals of amplifiers A1 and A2, so that a mismatching in the gate threshold voltage between transistors Q3 and Q4 can be cancelled. In addition, a voltage sources can be inserted in series between resistances R41 and R43 and a mismatching in the gate threshold voltage between transistors Q3 and Q4 can be cancelled by adjusting said voltage source(s).

As above, we have described the first and second embodiments of this invention as well as modifications of these. However, these descriptions do not exclude other modified embodiments and/or application examples nor include all aspects of the invention.

By embodiment of the invention, oscillation, instability and breakdown due to a sudden change of the load in the high output amplifiers can be effectively prevented.

The use of FETs(Field Effect Transistors) without minority carrier accumulation effect as transistors Q3 and Q4 of the output push-pull stage is desirable because it contributes to enhance speed of the high output amplifier of this invention.

When the high output amplifiers of this invention are used for applications such as device power sources for IC testers in which sudden changes of load tend to occur, it is beneficial and very advantageous.

We claim:

1. A high output amplifier driving a load at its output terminal, comprising:
   a comparison amplifier having a first input, a second input, and an output, wherein a set voltage is applied to said first input, a voltage of said output terminal is applied to said second input, and said output is generated in response to a difference between the voltage applied to said first input and the voltage applied to said second input;
   a low-pass filtering device that receives the output of the comparison amplifier, and that performs low-pass filtering of the output of said comparison amplifier and outputs it,
   a conversion device that converts the output of said low-pass filtering device to complementary signals; and
   a push-pull output device having a through current on a predetermined level that supplies electrical current to said load and that is driven by said complementary signals,
   wherein said low-pass filtering device is selected to suppress an increase in said through current in response to a change in said load,
   wherein said comparison amplifier is a complementary amplifier that generates complementary outputs, and further wherein said low-pass filtering device receives, combines and low-pass-filters said complementary outputs of said comparison amplifier.

2. A high output amplifier driving a load at its output terminal, comprising:
   a comparison amplifier having a first input, a second input, and an output, wherein a set voltage is applied to said first input, a voltage of said output terminal is applied to said second input, and said output is generated in response to a difference between the voltage applied to said first input and the voltage applied to said second input;
   a low-pass filtering device that receives the output of the comparison amplifier, and that performs low-pass filtering of the output of said comparison amplifier and outputs it,
   a conversion device that converts the output of said low-pass filtering device to complementary signals; and
   a push-pull output device having a through current on a predetermined level that supplies electrical current to said load and that is driven by said complementary signals,
   wherein said low-pass filtering device is selected to suppress an increase in said through current in response to a change in said load,
   wherein said comparison amplifier comprises:
      a buffer having a buffer output that receives the set voltage in the input of one side of said comparison amplifier; and
      a resistance element that connects said buffer output to the input of the other side of said comparison amplifier so that said output of the comparison amplifier can be obtained across said resistance element.

3. The high output amplifier as described in claim 1, wherein said low-pass filtering device is an integrating type adder amplifier.

4. A method of supplying current to a device to be tested by an IC tester comprising:
   providing a high output amplifier comprising:
      a comparison amplifier having a first input, a second input, and an output, wherein a set voltage is applied to said first input, a voltage of said output terminal is applied to said second input, and said output is generated in response to a difference between the voltage applied to said first input and the voltage applied to said second input;
      a low-pass filtering device that receives the output of the comparison amplifier, and that performs low-pass filtering of the output of said comparison amplifier and outputs it,
      a conversion device that converts the output of said low-pass filtering device to complementary signals; and
      a push-pull output device having a through current on a predetermined level that supplies electrical current to said load and that is driven by said complementary signals,
      wherein said low-pass filtering device is selected to suppress an increase in said through current in response to a change in said load;
      wherein said comparison amplifier is a complementary amplifier that generates complementary outputs, and further wherein said low-pass filtering device receives, combines and low-pass-filters said complementary outputs of said comparison amplifier, and
      coupling said push-pull output stage to said device to be tested by the IC tester.

5. The high output amplifier as described in claim 2, wherein said low-pass filtering device is an integrating type adder amplifier.

* * * * *